United States Patent [19]

Yamamoto et al.

[11] Patent Number: 5,244,874
[45] Date of Patent: Sep. 14, 1993

[54] PROCESS FOR PRODUCING AN ELONGATED SUPERCONDUCTOR

[75] Inventors: Susumu Yamamoto; Nozomu Kawabe; Tomoyuki Awazu, all of Hyogo, Japan

[73] Assignee: Sumitomo Electric Industries, Ltd., Osaka, Japan

[21] Appl. No.: 877,372

[22] Filed: Apr. 29, 1992

Related U.S. Application Data

[60] Continuation of Ser. No. 692,609, Apr. 29, 1991, abandoned, which is a division of Ser. No. 244,000, Sep. 14, 1988, abandoned.

[30] Foreign Application Priority Data

Sep. 14, 1987 [JP] Japan .................. 62-230639

[51] Int. Cl.$^5$ ............................................. H01L 39/24
[52] U.S. Cl. ........................................ 505/1; 29/599; 505/705
[58] Field of Search ............... 29/599; 505/1, 705, 505/917, 918, 919, 920; 252/514

[56] References Cited

U.S. PATENT DOCUMENTS 4,892,861 1/1990 Ray .................................. 505/1
4,952,554 8/1990 Jin et al. .

FOREIGN PATENT DOCUMENTS 0281444 9/1988 European Pat. Off. .

OTHER PUBLICATIONS

"High Tc Superconductors-Composite Wire Fabrication", Jin et al., *Applied Physics Letters*, Jul. 20, 1987.
Yamada, Y., et al., "Critical Current Density of Wire Type Y-Ba-Cu Oxide Superconductor" *Japanese Journal of Applied Physics*, vol. 26, No. 5, May 1987.

Primary Examiner—Joseph M. Gorski
Attorney, Agent, or Firm—Kerkam, Stowell, Kondracki & Clarke

[57] ABSTRACT

Improvement in a method for producing a superconducting wire of compound oxide such as $YBa_2Cu_3O_{7-\delta}$ by the steps comprising filling a metal pipe with a material powder, carrying out plastic deformation of the metal pipe and then subjecting the material powder in deformed metal pipe to sintering operation. The present invention is characterized in that the heat-treatment is carried out in the coexist of silver oxide: $Ag_2O$ placed inside the metal pipe.

20 Claims, No Drawings

PROCESS FOR PRODUCING AN ELONGATED SUPERCONDUCTOR

This application is a continuation of application Ser. No. 07/692,609, filed Apr. 29, 1991 and now abandoned which is a division of application Ser. No. 244,000, filed Sep. 14, 1988 and now abandoned.

BACKGROUND OF THE INVENTION

1. Field of the Invention

The present invention relates to a process for producing an elongated superconductor such as a superconducting wire. More particularly, it relates to a novel process for producing an elongated superconductor composed of a sintered compound oxide or a metal oxide complex having an improved mechanical strength as well as possessing a high critical temperature of superconductivity.

2. Description of the Related Art

Under the superconducting condition, the electric resistance become zero and the perfect diamagnetism is observed and electric current of a very high current density can be delivered without any loss of power.

Realization of superconducting coils which permit to generate a very high magnetic field is expected to accelerate development in the field of fusion power generation as well as in the field of MHD power generation or motor-generators. The development of superconducting coils is demanded also in the other industrial fields such as electric power reservation system; transportation systems such as magnetic levitation trains or magnetically propelling ships; medical appliances such as a high-energy beam radiation unit; or scientific instruments such as NMR.

In addition to the abovementioned electric power applications, the superconducting materials can be used in the field of electronics, for example, as a device using the Josephson effect in which quantum efficiency is observed macroscopically when an electric current is passed through a weak junction arranged between two superconductors. Tunnel junction type Josephson device which is a typical application of the Josephson effect is expected to be a high-speed and low-power consuming switching device owing to smaller energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption. However, the critical temperature of superconductivity could not exceed 23.2 K. of $Nb_3Ge$ which was the highest Tc for the past ten years.

The possibility of an existence of new types of superconducting materials having much higher Tc was revealed by Bednorz and Müller, who discovered a new oxide type superconductor in 1986 [Z. Phys. B64 (1986) 189].

It had been known that certain ceramic materials of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These superconductors, however, possess rather lower transition temperatures of about 10 K. and hence usage of liquidized helium (boiling point of 4.2 K.) as cryogen is indispensable to realize superconductivity.

The new type compound oxide superconductor discovered by Bednorz and Müller is represented by [La, Sr]$_2$CuO$_4$ which is called the K$_2$NiF$_4$-type oxide having a crystal structure which is similar to known perovskite type oxides. The K$_2$NiF$_4$-type compound oxides show such higher Tc as 30 K., which are extremely higher than known superconducting materials.

It was also reported that C. W. Chu et al discovered, in the United States of America, another superconducting material so called YBCO type represented by $YBa_2Cu_3O_{7-x}$ having the critical temperature of about 90 K. in February 1987. Still other type new superconducting materials which were reported recently are a compound oxide of Bi-Sr-Ca-Cu-O system and Tl-Ba-Ca-Cu-O system which exhibit such high Tc as more than 100 K. and which are chemically much stable than the abovementioned YBCO type compound oxide or the like. And hence, the possibility of an existence of high-temperature superconductors have burst onto the scene.

However, these new type superconducting materials are ceramic materials of compound oxides or metal oxide complexes which do not possess such a high plasticity as well-known metal type superconducting materials such as Ni-Ti alloy. In fact, they are produced by a sintering technique in which a compact of powder material is sintered in a furnace. However, the sintered articles are fragile and easily brake even under a very weak mechanical stress, so that they can not or are difficult to be shaped or deformed into a desired shape such as a wire by the conventional plastic deformation techniques. In order to realize a reliable and practical superconducting structure, it is indispensable that the structure possesses enough strength and tenacity which is sufficient to endure bending force during usage.

Taking the abovementioned situation into consideration, the present inventors have proposed a process for manufacturing a ceramic wire by the steps comprising filling a metal pipe with a material powder of ceramic, performing plastic deformation of the metal pipe filled with the ceramic metal powder by wire-drawing or forging technique to reduce the cross section of the metal pipe so that the metal pipe is shaped into a desired configuration and the density of the material powder in the pipe is increased, and then subjecting the deformed metal pipe to heat-treatment to sinter the ceramic material powder in the metal pipe in an European patent application No. 88 400 257.6. This process is very effective and advantageous for producing superconducting wires because the outer metal pipe possesses satisfactory mechanical strength against outer stress and functions as a by-pass circuit when the superconductivity break down.

However, we found such a fact that the superconducting property of the product obtained by this process is inferior to that of a sintered block which is produced by sintering the material powder outside the metal pipe in air or in an oxygen atmosphere. This may be caused by insufficient oxygen deficiency in the crystal of the sintered product obtained. Namely, it is difficult to control the oxygen contents in the crystal, if the material powder is sintered in a closed atmosphere in the metal pipe, in other words, without exposing the material powder to oxygen atmosphere during the sintering stage.

In fact, it is known that the oxygen contents in the crystal is a critical factor for realizing desired properties of the superconductor and hence the precise control of the oxygen contents in a surrounding atmosphere during the sintering stage is indispensable. For this purpose, the material powder is heated in an oxygen atmosphere.

A typical process for producing a superconducting sintered block comprises the following steps.

At first, a powder mixture of compounds of constituent metal elements of which the superconducting sintered block is composed, for example a mixture of metal oxides is shaped into a compact. Then, the compact is heated under a partial oxygen pressure of about 1 atom to sinter the compact. The resulting sintered mass is cooled down or annealed slowly to 300° to 400° C. under the same oxygen partial pressure for from several hours to a dozen or so hours. Finally, the sintered mass is cooled to a room temperature. The annealing stage is believed to be an indispensable stage for realizing and stabilizing the superconducting property having a desired high critical temperature because the oxygen contents in the crystal obtained is influenced by the annealing condition.

However, as is described above, in the case that the material powder is sintered inside the metal pipe, it is difficult or impossible to exposed the material powder to the surrounding oxygen atmosphere during the annealing stage.

In order to solve this problem, it was proposed to use a pipe made of silver (Ag). The present inventor proposed an improvement in a process for producing a superconducting wire having an outer metal pipe made of silver in European patent application No. 88 401 064.6. In fact, if the silver pipe is used as the outer metal pipe, the oxygen contents inside the pipe can be controlled during the annealing stage since oxygen can pass through an wall of the silver pipe and can penetrate into the silver pipe. Namely, since the silver is an easily oxidizable metal, if a difference in oxygen density exists between inside and outside the silver pipe, oxidation propagate from outside to inside gradually, so that it looks like penetration of oxygen into the silver pipe.

However, the silver is not only a costly material which can not be used industrially but also can not prevent oxygen from re-escaping through the silver pipe from the resulting wire. Another problem of the resulting wire having such outer silver pipe resides in that the outer pipe is oxidized easily.

Therefore, an object of the present invention is to provide a novel process for producing an elongated superconductor which is composed of a sintered compound oxide or a metal oxide complex and which has an improved mechanical strength as well as a high critical temperature of superconductivity with a reduced cost.

SUMMARY OF THE INVENTION

The present invention provides a process for producing a sintered elongated article by the steps comprising filling a metal pipe with a material powder, carrying out plastic deformation of the metal pipe filled with the material powder and then subjecting the deformed metal pipe filled with the material powder to a heat-treatment at a sinter temperature of the material powder, characterized in that the heat-treatment is carried out in the presence of silver oxide placed inside the metal pipe.

The silver oxide which is generally represented by $Ag_2O$ decompose above 160° C. to release oxygen (O). Therefore, if $Ag_2O$ exist together with the material powder, the oxygen released from $Ag_2O$ is supplied to the material powder during the sintering stage and/or the annealing stage.

According to the present invention, oxygen supply to the material powder is assured by the presence of $Ag_2O$ inside the metal pipe, so that the metal pipe can be made of cheap metal such as Cu, Fe, Al or any other material through which oxygen can not pass.

The silver oxide such as $Ag_2O$ can be placed in a variety forms or modes inside the metal pipe. For example, a powder of silver oxide may be admixed with the material powder and then the resulting powder mixture is compacted in the metal pipe. In this case, the reduced silver (Ag) remain in the sintered product and will react with the sintered mass or will contaminate the same, resulting in deteriorate the superconducting properties.

In order to avoid this problem, the silver oxide such as $Ag_2O$ is preferably placed in a limited area locally inside the metal pipe, namely only in the neighborhood of an inner surface of the metal pipe. In this case, the above-mentioned contamination or chemical reaction between the reduced silver and the sintered mass can be limited to a superficial region of the sintered mass only and the major portion of the sintered mass is not influenced by the presence of silver.

In order to localize the silver oxide, a layer of the silver oxide is formed on the inner surface of the metal pipe at first. Then, the material powder is compacted inside the silver oxide layer supported on the metal pipe. It is also possible to feed both of the silver oxide powder and the material powder simultaneously into a metal pipe through such a feeder as having two coaxial inner and outer cones each connected to a drop-pipe so that the material powder is dropped through an inner drop-pipe and simultaneously the silver oxide is dropped through an annular space defined between the inner drop-pipe and the outer drop-pipe, while the feeder is elevated gradually.

Such layer of the silver oxide can be formed, for example, by oxidizing a film of silver which is deposited on the inner surface of the metal pipe by electric plating, electroless plating or by physical vapour deposition.

The precondition of the present invention, namely a series of steps from the filling step of a metal pipe with a material powder, the plastic deformation step of the powder-filled metal pipe and the heat-treatment step to sinter the material powder are similar to our previous cases described in European patent application No. 88 401 064.6 and No. 88 402,030.6. The contents of the specifications of these European patent applications are referred in the present specification.

The plastic deformations is preferably carried out in such manner that a compressive stress is exerted onto the powder material filled in the metal pipe. Since the density of the powder material compacted in the metal pipe is not high, it is also preferable to perform the plastic deformation by hot-plastic deformation in order to increase the density of the product. The expression of "hot-plastic deformation" mean such a plastic deformation that is performed at a temperature which is higher than a re-crystallization temperature of a metal of which the metal pipe is made. In fact, the deformation of the metal pipe can be effected advantageously above the temperature since the resistance to deformation decrease remarkably and a high malleability is achieved without work hardness even if re-crystallization occur after the deformed pipe is cooled down to ambient temperature. In practice, the hot-plastic deformation is carried out at a temperature which is lower than a melting point of said metal by at least 10° C. or more to prevent fusion of the metal pipe.

The plastic deformation can be carried out by the conventional technique selected from wire-drawing through a die or dies, wire-drawing by a roller die or roller dies, extrusion, forging, swaging or rolling. Persons skilled in the art can select the mode or type of plastic deformation which depends on the material of the metal pipe and the nature of the powder material.

The plastic deformation used in the present invention include a rolling work for producing a tape-shaped article, a pipe reduction work for producing a rectangular pipe, a coil forming work for deforming a wire into a coil or the like.

The plastic deformation is carried out by a combination of a plurality of unit operations each of which is same and/or different in mode. In other words, the same or different elemental plastic deformation can be effected on the metal pipe successively and/or alternately in order to improve the quality of the product. Examples of the combination of unit operations are a combination of wire-drawing and forging whose objects are different from each other, a combination of wire-drawing through a die and swaging are performed by different means, and a combination of hot-plastic deformation and cold-plastic deformation which are carried out under different conditions A combination of the plastic deformation and the sintering can be repeated for more than two times. In this case, the plastic deformation is effected before and/or after the final sintering stage. Specially, when shrinkage of the sintered mass occur during the sintering stage, a clearance is left between the metal pipe and the sintered mass. If it is desired to remove or reduce such clearance, the metal pipe subjected to the sintering operation is passed through at least one plastic deformation stage. In this case, the plastic deformation is preferably carried out by a cold-plastic deformation.

The hot-plastic deformation stage follows after the cold wire-drawing stage in order to increase the density of powder filled in the metal pipe. Namely, an initial metal pipe filled freshly with the powder material can be deformed by the cold-plastic deformation easily and effectively since the density of compacted powder is not so high in this stage. To the contrary, after the metal pipe is passed through such cold-plastic deformation and hence the density becomes to a certain level, further increment of the density can be assured by the hot-plastic deformation rather than the cold-plastic deformation. This system of the cold-plastic deformation followed by the hot-plastic deformation is preferable to prepare a compact for the final sintering stage.

The material of the metal pipe is selected from metals which can be deformed by plastic deformation work and may be selected from a group comprising Fe, Ni, Co, Cu, Al and their alloys. According to the present invention, it is not necessary to use a metal pipe made of precious metal such as Ag, Au or Pt. The metal pipe may have any dimension. An endless metal pipe can be produced by feeding the material powder onto an endless metal strip during the metal strip is shaped into a pipe in the conventional pipe forming machine and then by passing the shaped pipe to a tunnel type sintering furnace in the sintering stage. According to the present invention, in order to prevent oxygen from escaping out of the pipe, the opposite ends of the metal pipe is closed before the sintering stage.

The sintering operation of the powder mixture is carried out at temperature which is higher than 700° C. but is not higher than the lowest melting point of any component in the material powder to be sintered. If the sintering temperature exceeds the lowest melting point, a liquid phase will be produced, resulting in lowering the superconducting property. To the contrary, if the sintering temperature is not higher than 700° C., oxygen release resulting from decomposition of $Ag_2O$ can not be realized since the decomposition temperature of $Ag_2O$ is about 160° C.

The cooling operation is preferably carried out at relatively slower cooling velocity and is selected in a range from 1° C./sec to 0.01° C./sec. In fact, if the cooling rate exceeds 1° C./sec, satisfactory orientation of the crystalline structure can not be realized, while a slower cooling rate than 0.01° C./sec is not economical as the industrial operation. Particularly, the sintered mass is preferably cooled very slowly during its early stage from the sintering temperature to about 400° C.

DESCRIPTION OF THE PREFERRED EMBODIMENT

The superconductors which can be prepared by the present invention include a superconductor of a compound oxide having the general formula:

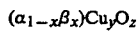

$$(\alpha_{1-x}\beta_x)Cu_yO_z$$

in which $\alpha$ stands for an element selected from IIa group of the Periodic Table, $\beta$ stands for at least one of elements selected from IIIa group of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1z \leq 5$ respectively.

In order to produce this type superconductor, a material powder mixture is prepared at first. The material powder mixture may be (1) a mixture of compounds of metal elements, such as oxide or carbonate of $\alpha$, $\beta$ and Cu and more preferably (2) a sintered powder which is prepared by sintering the powder mixture (1) and then pulverizing the sintered mass.

Of course, proportions of the compounds are adjusted in such a manner that an atomic ratio of $\alpha:\beta:Cu$ in the mixture satisfies the general formula.

The sintering operation of the powder mixture is carried out at a temperature which is higher than 700° C., as above-mentioned and depend on the kind of the metal pipe and of the compound oxide. Usually, the following sintering conditions are preferably selected:

| Metal pipe | Sintering condition |
|---|---|
| Cu | at 750 to 820° C. for 10 to 20 hours |
| Ni | at 700 to 770° C. for 10 to 20 hours |

The optimum sintering conditions are at 800° C. for 15 hours for Cu and at 750° C. for 15 hours for Ni.

In a preferred system, the element $\alpha$ is Ba or Sr and the element $\beta$ is at least one element selected from a group comprising Y, La, Gd, Dy, Ho, Er, Tm, Yb, Nd, Sm, Eu and Lu and an atomic ratio of $\alpha:\beta:Cu$ is 2:1:3 so that the resulting compound oxide may be represented by the general formula:

$$Ln_1Ba_2Cu_3O_{7-\delta}$$

in which Ln stands for at least one element selected from a group comprising Y, La, Gd, Dy, Ho, Er, Tm, Yb, Nd, Sm, Eu and Lu and $\delta$ satisfies a range of $0<\delta<1$.

Thus, the preferable compound oxides are Ln-Ba-Cu-O system including the following special cases:

| | | |
|---|---|---|
| $Y_1Ba_2Cu_3O_{7-\delta}$, | $Ho_1Ba_2Cu_3O_{7-\delta}$, | $Lu_1Ba_2Cu_3O_{7-\delta}$, |
| $Sm_1Ba_2Cu_3O_{7-\delta}$, | $Nd_1Ba_2Cu_3O_{7-\delta}$, | $Gd_1Ba_2Cu_3O_{7-\delta}$, |
| $Eu_1Ba_2Cu_3O_{7-\delta}$, | $Er_1Ba_2Cu_3O_{7-\delta}$, | $Dy_1Ba_2Cu_3O_{7-\delta}$, |
| $Tm_1Ba_2Cu_3O_{7-\delta}$, | $Yb_1Ba_2Cu_3O_{7-\delta}$, | $La_1Ba_2Cu_3O_{7-\delta}$, | in which $\delta$ is a number which satisfies a range of $0<\delta<1$.

The above-mentioned compound oxides preferably possess perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

Another superconducting compound oxide which can be prepared by the present invention is represented by the general formula:

$$(M, Sr)_2CuO_{4-\delta}$$

in which M stands for Y or La and $\delta$ satisfies a range of $0<\delta<1$.

The other type superconducting compound oxide which can be prepared by the present invention is represented by the general formula:

$$\Theta_4(\Phi_{1-q}, Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying a range of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$. This system is considered to be a single phase of the following compound oxide or a mixed phase consisting mainly thereof:

| | |
|---|---|
| $Bi_4Sr_4Ca_4Cu_6O_{20-r}$, | $Bi_2Sr_2Ca_2Cu_3O_{10-r}$, |
| $Tl_4Ba_4Ca_4Cu_6O_{20-r}$, | $Tl_2Ba_2Ca_2Cu_3O_{10-r}$, | in which r is a number which satisfies a range of $-2 \leq r \leq +2$.

In a conclusion, according to the present invention, satisfactory oxygen can be supplied to the material powder to be sintered in the metal pipe during the sintering stage and/or annealing stage, resulting in that a superconductor possessing superior superconducting properties is produced. Still more, the resulting superconducting wire has an improved mechanical strength and a resistance to deterioration.

Now, an embodiment of the process according to the present invention will be described by Example, but the scope of the present invention should not be limited thereto.

EXAMPLE 1

A powder of Ba having a purity of 99.9%, a powder of $Y_2O_3$ having a purity of 99.9% and a powder of CuO having a purity of 99.99% are mixed in such a proportion that an atomic ratio of Ba:Y:Cu becomes 2:1:3. The mixture is kneaded in a mortar and then is moulded in a press under a pressure of 100 kg/cm² to produce a compact. The compact was sintered at 940° C. for 15 hours in a sintering furnace. When the sintering complete, the sintered mass is left in the same sintering furnace at 350° C. for 15 hours and then cooled down to ambient temperature. Then, the sintered mass is pulverized. The steps from the compacting to pulverization are repeated for three times to obtain a fine sintered powder material having a particle size of less than 10 μm.

The resulting fine sintered powder is filled in five copper pipes (Samples 1 to 5) each having an outer diameter of 10 mm and a wall thickness of 2 mm and opposite ends of the pipe are closed.

Two copper pipes (Samples 1 and 2) are coated with a paste composed of $Ag_2O$ powder and an organic binder with a thickness of 0.5 mm on its inner surface and then the material powder is charged in the pipe.

Two copper pipes (Samples 3 and 4) are filled directly with the material powder [comparative examples].

One copper pipe (Sample 5) is filled with a mixture of $Ag_2O$ powder and the material powder in a proportion by weight of 1:10.

After the opposite ends are closed, the pipes are passed through a swaging unit to obtain wires each having a reduced outer diameter of 6 mm.

Then, the wires are passed to a sintering furnace to sinter the powder at 940° C. for 10 hours. After the heat-treatment complete, the wires are cooled down to 350° C. and are left in this temperature for 10 hours. Then, the wire is cooled to room temperature.

In order to determine the superconductivity, electrodes are connected with a silver paste to the sintered mass of the samples and immersed in liquidized nitrogen. The superconducting property of the samples determined by the conventional four probe method is shown in Table 1. The temperature is determined by a calibrated Au(Fe)-Ag thermocouple.

The result are summarized in Table 1.

TABLE 1

| Sample No. | Critical temperature (K.) |
|---|---|
| 1 | 91 |
| 2 | 66 |
| 3 | 47 |
| 4 | 39 |
| 5 | 72 |

We claim:

1. A process for producing a sintered elongated superconductor comprising the steps of:
   depositing a layer of silver oxide on an inner surface of a metal pipe;
   filling said metal pipe having said layer of silver oxide on its inner surface with a material powder to be formed into said superconductor, said material powder being of a composition which will form a ceramic oxide superconductor;
   plastically deforming said metal pipe filled with the material powder; and heat treating the deformed metal pipe filled with the material powder at a sintering temperature at or above 700° C., thereby sintering said material powder and rendering said material powder superconducting.

2. The process set forth in claim 1 wherein said depositing step includes coating said inner surface of the metal pipe with a paste composed of $Ag_2O$ and organic binder.

3. The process set forth in claim 1 wherein said depositing step comprises depositing a film of silver on the inner surface of the metal pipe and oxidizing said film of silver.

4. The process set forth in claim 3 wherein said depositing step comprises plating said film of silver on the inner surface of the metal pipe.

5. The process set forth in claim 3 wherein said depositing step comprises depositing said film of silver by physical vapour deposition.

6. The process set forth in claim 1 wherein said metal pipe is made of a metal selected from the group consisting of Fe, Ni, Co, Cu, Al and alloys thereof.

7. The process set forth in claim 1 wherein said depositing step comprises depositing said silver oxide in recesses which are formed on the inner surface of the metal pipe in parallel with an axial direction of the metal pipe.

8. The process set forth in claim 1 wherein said plastically deforming step comprises deforming said metal pipe such that said metal pipe exerts a compressive stress to said material powder filled in the metal pipe.

9. The process set forth in claim 8 wherein said plastically deforming step comprises wire-drawing said metal pipe.

10. The process set forth in claim 1 wherein said plastically deforming step includes deforming said metal pipe with at least one cold-plastic deformation stage.

11. The process set forth in claim 10 wherein said cold-plastic deformation stage comprises wire-drawing said metal pipe.

12. The process set forth in claim 1 wherein the step of plastically deforming comprises performing a plurality of unit operations.

13. The process set forth in claim 1 including repeating said plastically deforming step and said heat treating step for more than two times.

14. The process set forth in claim 1 wherein said material powder is powder mixture composed of a compound of an element $\alpha$ selected from IIa group of the Periodic Table, a compound of an element $\beta$ selected from IIIa group of the Periodic Table, and a compound of copper.

15. The process set forth in claim 14 wherein said material powder comprises a sintered powder which is prepared by sintering said powder mixture and then pulverizing the resulting sintered mass, and wherein said filling step includes compacting said sintered material powder in the metal pipe.

16. The process set forth in claim 15 wherein said sintered powder consists essentially of a compound oxide represented by the general formula:

$$(\alpha_{1-x}\beta_x)Cu_yO_z$$

wherein x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

17. The process set forth in claim 16 wherein said element $\alpha$ is one of Ba and Sr and said element $\beta$ is at least one element selected from the group consisting of Y, La, Gd, Dy, Ho, Er, Tm, Yb, Nd, Sm, Eu and Lu.

18. The process set forth in claim 1 wherein said material powder is a sintered powder consisting essentially of a compound oxide represented by the formula:

$$\Theta_4(\Phi_{1-q}, Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satisfies a range of $-2 \leq r \leq +2$.

19. The process set forth in claim 1 including performing said plastically deforming step by utilizing means selected from the group consisting of a die or dies, a roller die or roller dies, an extruder, a forging unit, a swaging unit and a rolling unit.

20. A process for producing a sintered elongated superconductor comprising the steps of:
depositing a layer of silver oxide on an inner surface of a pipe made of a metal;
filling said metal pipe having said layer of silver oxide on its inner surface with a material powder to be formed into said superconductor, said material powder being of a composition which will form a ceramic oxide superconductor;
plastically deforming said metal pipe filled with the material powder; and
heat treating the deformed metal pipe filled with the material powder at a sintering temperature at or above 700° C., thereby sintering said material powder and rendering said material powder superconducting, wherein said metal of said pipe prevents oxygen from passing therethrough during said plastically deforming step and said heat treating step.

* * * * *